United States Patent [19]

Laux et al.

[11] 4,331,907
[45] May 25, 1982

[54] DEFLECTION CIRCUIT LINEARITY COIL

[75] Inventors: David E. Laux; Kenneth E. Meyer, both of Indianapolis, Ind.

[73] Assignee: RCA Corporation, New York, N.Y.

[21] Appl. No.: 137,522

[22] Filed: Apr. 4, 1980

[51] Int. Cl.³ .................. H01J 29/70; H01H 7/02
[52] U.S. Cl. ....................... 315/400; 315/371; 335/213; 336/110
[58] Field of Search .............. 336/110; 315/371, 400; 335/213

[56] References Cited

U.S. PATENT DOCUMENTS

| | | | |
|---|---|---|---|
| 3,209,295 | 9/1965 | Baermann | 336/110 X |
| 3,434,001 | 3/1969 | Okuda | 315/400 |
| 3,555,350 | 1/1971 | Okuda | 315/400 X |
| 3,571,606 | 3/1971 | Kikuchi | 336/110 X |
| 3,863,184 | 1/1975 | Thibodeau et al. | 336/110 |

FOREIGN PATENT DOCUMENTS 1247304 9/1971 United Kingdom .
1424037 2/1976 United Kingdom .

*Primary Examiner*—Malcolm F. Hubler
*Attorney, Agent, or Firm*—Eugene M. Whitacre; Paul J. Rasmussen; Joseph J. Laks

[57] ABSTRACT

To provide linearity correction to horizontal scanning current, a linearity coil is coupled to the horizontal deflection winding of a horizontal deflection circuit. The magnetic structure of the linearity coil includes a magnetizable material with generally rectangularly cross-sectioned center and end sections. The faces of the end sections are oriented generally perpendicular to an axis of the center section thereby forming an H-bar core. The H-bar core is located inside a plastic coilform cup, with the sides of the cup generally conforming to the shape of the core. Permanent magnets for biasing the H-bar core are located at opposite ends of the coilform cup adjacent the end sections of the core. The linearity coil conductor turns are wound around the coilform cup over the center section of the H-bar core.

18 Claims, 13 Drawing Figures

DEFLECTION CIRCUIT LINEARITY COIL

This invention relates to linearity coil structures for deflection circuits

In a typical horizontal deflection circuit, during the horizontal trace interval, the trace switch applies a trace voltage to the horizontal deflection winding to produce the required sawtooth-shaped scanning current in the winding. Due to resistive losses in the yoke and trace switch, the sawtooth scanning current, during trace, exhibits an exponential decay, having either a steeper slope at the beginning of horizontal trace or a shallower slope at the end of trace than is desirable for linear scanning. The displayed raster appears distorted, with the side of the raster associated with the beginning of trace appearing expanded relative to the other side of the raster.

To correct the raster distortion produced by nonlinear horizontal scanning, a saturable reactor linearity coil is placed in series with the horizontal deflection winding. A permanent magnet biases the core of the linearity coil such that when horizontal scanning current flows in the coil, the inductance value of the coil changes during scan. The linearity coil exhibits a relatively large inductance at the beginning of scan in order to compress the first half of the raster and exhibits a relatively constant, lower inductance during the second half of scan to maintain the second half of the raster relatively undistorted.

A feature of the invention is the design of a linearity coil structure which permits a relatively large maximum-to-minimum inductance ratio to be exhibited by the linearity coil during horizontal scan. Another feature of the invention is the design of a linearity coil core structure which is easily manufacturable and requires a relatively small number of processing steps in its manufacture. The core of the linearity coil structure includes generally rectangularly cross-sectioned center and end sections with the faces of the end sections oriented generally perpendicular to an axis of the center section to form an H-bar core. A coilform cup with sides generally conforming to the shape of the H-bar core receives the core through an opening in the cup. A permanent magnet is located in the coilform cup adjacent one of the end sections of the core to magnetically bias the core. A linearity coil has conductor turns wound around the coilform cup over the center section of the H-bar core.

A third feature of the invention is the construction of the linearity coil in such a manner that the inductance of the linearity coil is adjustable, thereby eliminating the need for a separate raster width circuit or alternatively a separate raster centering circuit. The end walls of the coilform cup are formed with inwardly directed bosses. The associated permanent magnets have complementary indentations or notches formed in the sides of the magnets. The bosses function as a securing mechanism or as a spring detent in cooperation with the notches in magnet sides to hold the permanent magnets at different levels above the bottom of the coilform cup adjacent the sides of the H-core. The amount of surface area contact between the permanent magnet and the end sections of the H-bar determines the exact fraction of bias flux developed by the permanent magnets that is coupled to the H-bar core. By locating the bosses in different ones of the indentations in the sides of the permanent magnets, the contact surface area between the permanent magnets and the H-bar core, and, thus, the inductance of the linearity coil at the beginning of scan may be adjusted to provide raster centering or width control.

Figure 1:
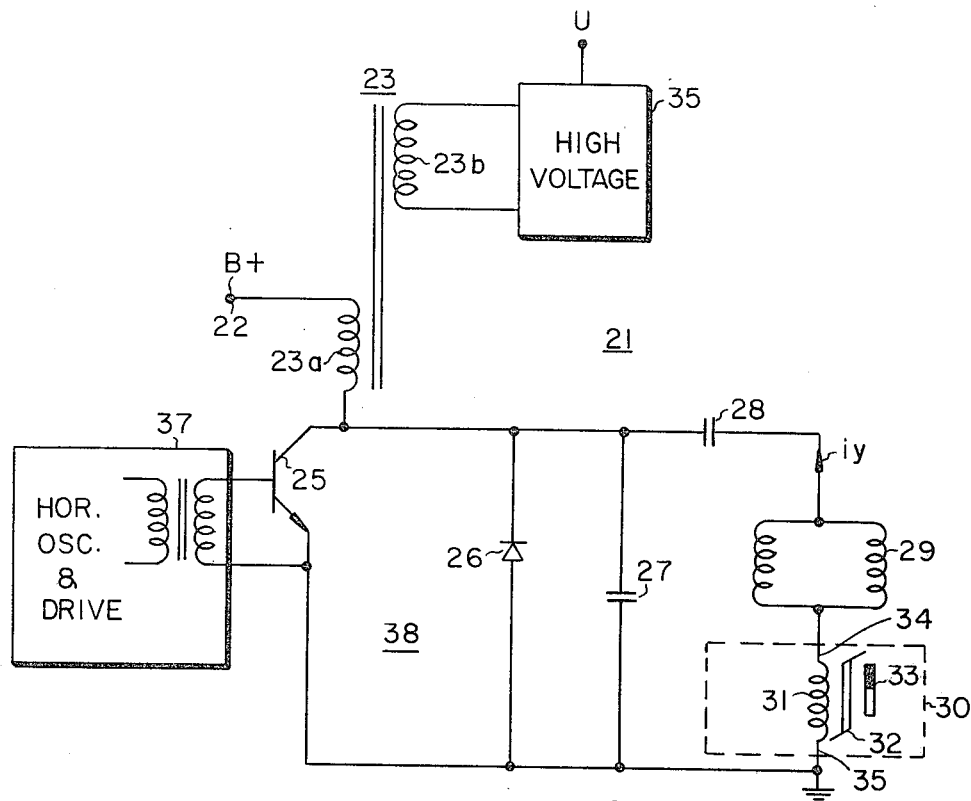
FIG. 1 illustrates the electrical schematic of a horizontal deflection circuit including a linearity corrector embodying the invention.

In a horizontal deflection circuit 21, illustrated in FIG. 1, a B+ scanning voltage is applied to a terminal 22. Terminal 22 is coupled to a horizontal deflection generator 24 through the primary winding 23a of a horizontal output or flyback transformer 23. Horizontal deflection generator 24 includes a conventional horizontal oscillator and driver 37, a trace switch 38 comprising a horizontal output transistor 25 and a damper diode 26 and a retrace capacitor 27. Coupled across trace switch 38 is the series arrangement of an S-shaping or trace capacitor 28, a horizontal deflection winding 29, and a linearity corrector 30. Linearity corrector 30 is schematically illustrated in FIG. 1 as comprising a coil or winding 31, a core 32 and a permanent magnet 33. A lead conductor 34 of linearity coil 31 is coupled to horizontal deflection winding 29 and a lead conductor 35 is coupled to ground.

During the horizontal retrace interval, trace switch 38 is nonconductive. The horizontal deflection current $i_y$ undergoes an approximately half period sinusoidal oscillation and a retrace pulse voltage is developed across horizontal deflection winding 29. The retrace pulse voltage is applied to flyback transformer primary winding 23a to develop a high voltage retrace pulse across a high voltage secondary winding 23b of the flyback transformer. A high voltage circuit 36 coupled to winding 23b develops an ultor accelerating potential at a terminal U which is applied to the ultor of a picture tube, not shown.

During the horizontal trace interval, trace switch 38 is closed and the trace voltage developed across capacitor 28 is applied to horizontal deflection winding 29. A sawtooth waveform horizontal scanning current is generated in deflection winding 29. The sawtooth scanning waveform, to provide linear scanning, is ideally represented by the S-shaped waveform 39 during the horizontal trace interval $t_1$–$t_3$, as illustrated by the solid-line curve in FIG. 2. In the absence of linearity corrector 30, the horizontal scanning waveform departs from the ideal to take the form of waveform 40, illustrated by the dashed-line curve in FIG. 2, thereby introducing linearity distortion to the displayed raster. The distortion of the ideal horizontal scanning waveform is due, for example, to resistive losses developed in trace switch 38 and horizontal deflection winding 29 during the horizontal trace interval. The slope of waveform 40 is steeper than the ideal during the first part of trace between times $t_1$–$t_2$ and flattens out, due to resistive losses, to the ideal in the second part of trace between times $t_2$–$t_3$.

Figures 2, 12:
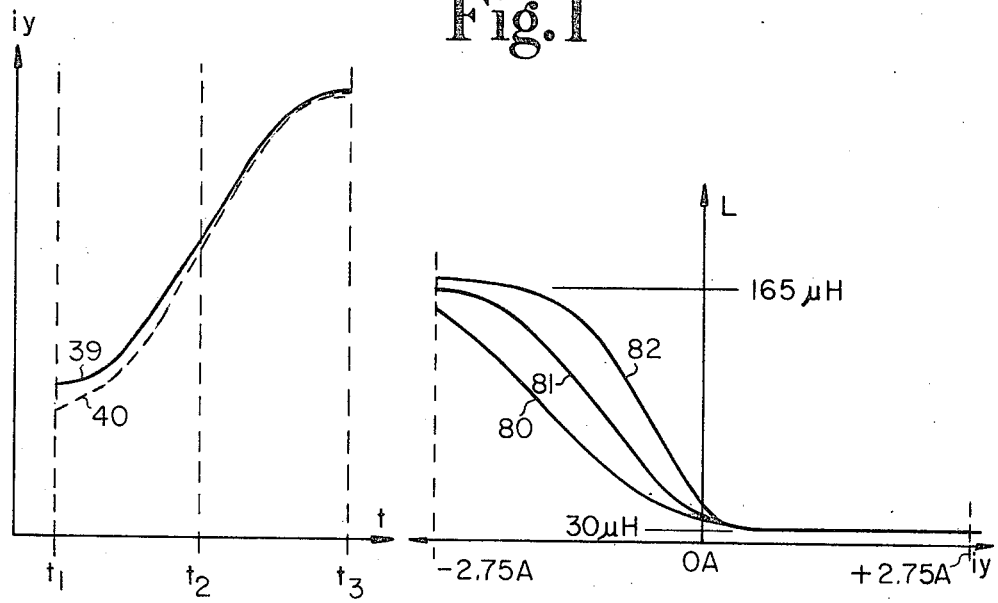
FIG. 2 illustrates waveforms used in explaining the operation of the circuit in FIG. 1.
FIG. 12 illustrates typical curves of inductance versus current flowing through the linearity corrector of FIG. 1.

To perform the required linearity correction, the inductance L of linearity corrector 30 varies with the value of the deflection current $i_y$ flowing, as illustrated in FIG. 12 by curve 81. Thus, the inductance of linearity corrector 30 is greater at the beginning of trace and decreases thereafter until reaching a relatively constant saturation value for the second part of trace.

In many television receivers, the inductance of linearity corrector 30 at the beginning of trace may be a substantial percentage of the inductance of the horizontal deflection winding. Also, the ratio of maximum inductance to the minimum inductance exhibited at the end of trace may be quite substantial. For example, a color television receiver may include an in-line 100° wide-angle color picture tube with a saddle-type horizontal deflection winding requiring 5½ amperes peak-to-peak horizontal scanning current. The inductance of the horizontal deflection winding may be one millihenry and the resistance may be one ohm. The horizontal deflection winding may exhibit a relatively low Q of around 30 at the "S" shaping frequency. In such a television receiver, linearity corrector 30 may be required to exhibit a maximum inductance of 165 microhenry at the beginning of horizontal scan and a minimum inductance of 27 microhenry at the end of scan. Thus, linearity corrector 30 must be constructed so as to meet the relatively stringent requirement of exhibiting a maximum inductance of about 15% of that of the horizontal deflection winding and a 6-to-1 change in inductance during horizontal scan.

Figure 3:
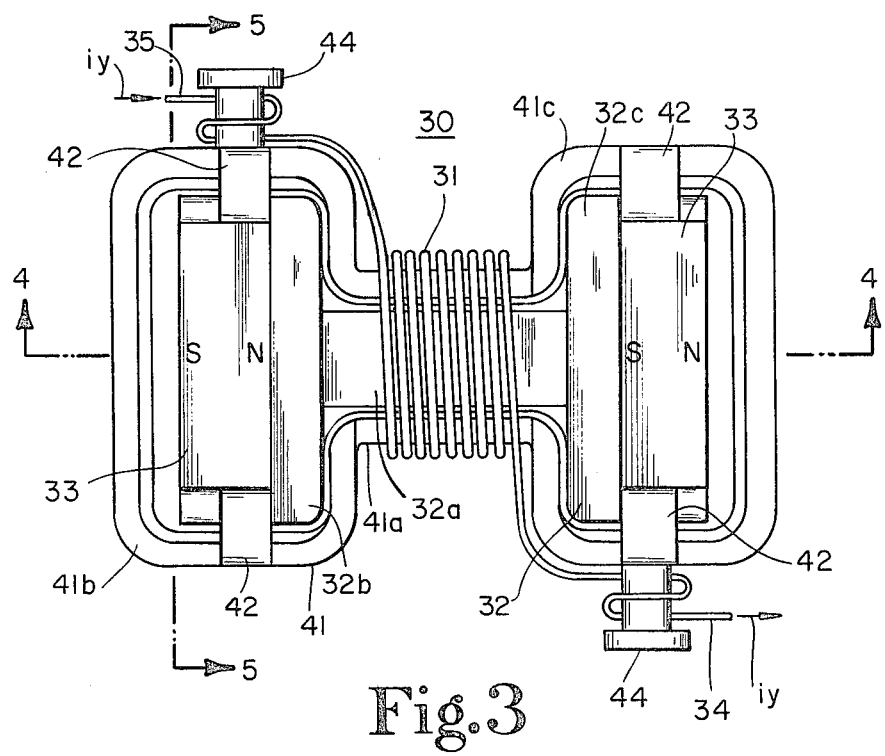
FIG. 3 illustrates a top elevation view of a linearity corrector structure embodying the invention.
Figure 4:
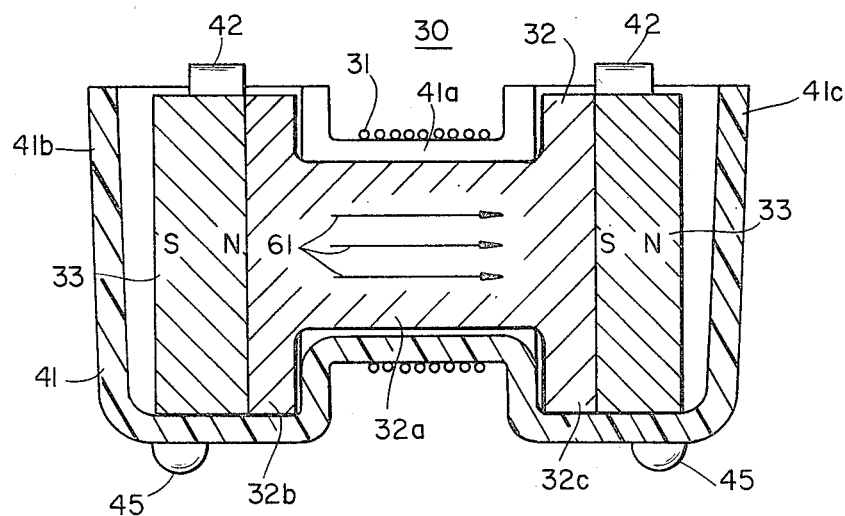
FIG. 4 illustrates a cross-sectional side view of the structure of FIG. 3 taken along the cross-sectional line 4—4 of FIG. 3.
Figure 5:
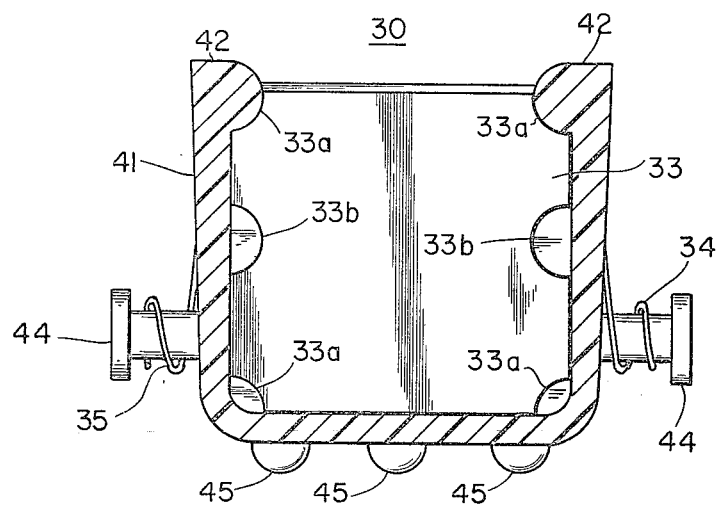
FIG. 5 illustrates a cross-sectional end view of the structure of FIG. 3 taken along the cross-sectional line 5—5 of FIG. 3.

A linearity corrector structure 30, embodying the invention and capable of exhibiting a relatively large maximum inductance and a large change in inductance during horizontal scan, is illustrated in the various views of FIGS. 3–5. The linearity corrector structure 30 comprises a magnetic core 32, permanent magnets 33, a plastic housing 41 and a linearity coil or winding 31 wound around the center portion 32a of core 32. Plastic housing 41 has spherical feet 45 formed in the bottom of the housing to enable the assembly to rest securely in holes in a television receiver printed circuit board.

Figure 7:
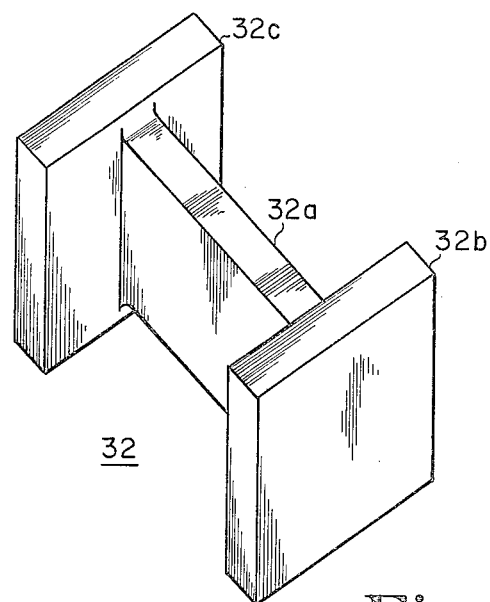
FIG. 7 illustrates a perspective view of the core of the structure of FIG. 3.

As illustrated in FIG. 7, magnetic core 32 comprises a thin, generally rectangular cross-sectional center section 32a, widening to form end sections or flanges 32b and 32c of generally rectangular cross-section. The faces of the end section flanges 32b and 32c are oriented generally perpendicular to the length or long axis of the center section 32a, the sections thereby forming an H-bar core arrangement.

Figure 8:
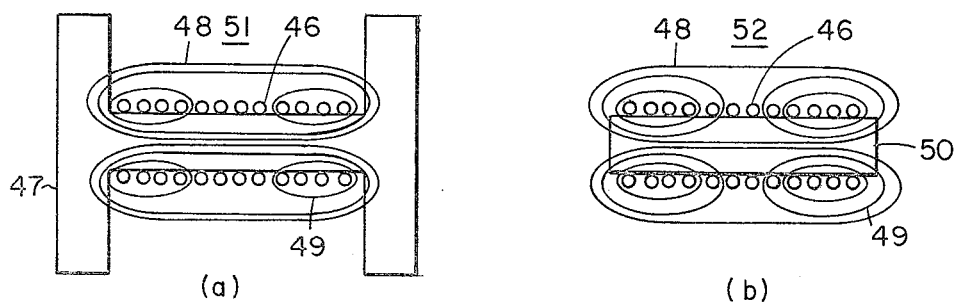
FIG. 8 illustrates flux linkage paths existing with different core configurations.

A linearity corrector having an H-bar core configuration with relatively wide end flanges is advantageous to enable the corrector to exhibit a relatively large maximum inductance in a relatively small, compact structure. FIG. 8a illustrates the flux linkage of an inductor 51 having conductor turns 46 wound around the center section of an H-core 47. FIG. 8b illustrates the flux linkage of an inductor 52 having the same number of conductor turns 46 wound around a rod core 50 having the same length and cross-sectional area as that of the center section of H-core 47. As illustrated in FIG. 8a, the relatively wide end flanges of H-core 47 provide a relatively low reluctance return path for flux lines 48 which link all of the conductor turns 46 of inductor 51. Thus, a relatively large number of flux lines 48 are generated which link all of the conductor turns of the inductor, and a relatively small number of flux lines, such as flux lines 49, are generated which link only a few of the conductor turns 46. In contrast, the current flowing in the conductor turns of rod core inductor 52, because of the absence of core end flanges, generates a relatively large number of flux lines 49 which do not link all of the conductor turns. The total flux linkage and thus the self-inductance of H-core inductor 51 is greater than the total flux linkage and self-inductance of rod core inductor 52. By designing linearity corrector 30 with an H-bar core, a relatively large inductance may be obtained in a relatively small structure.

Figure 9:
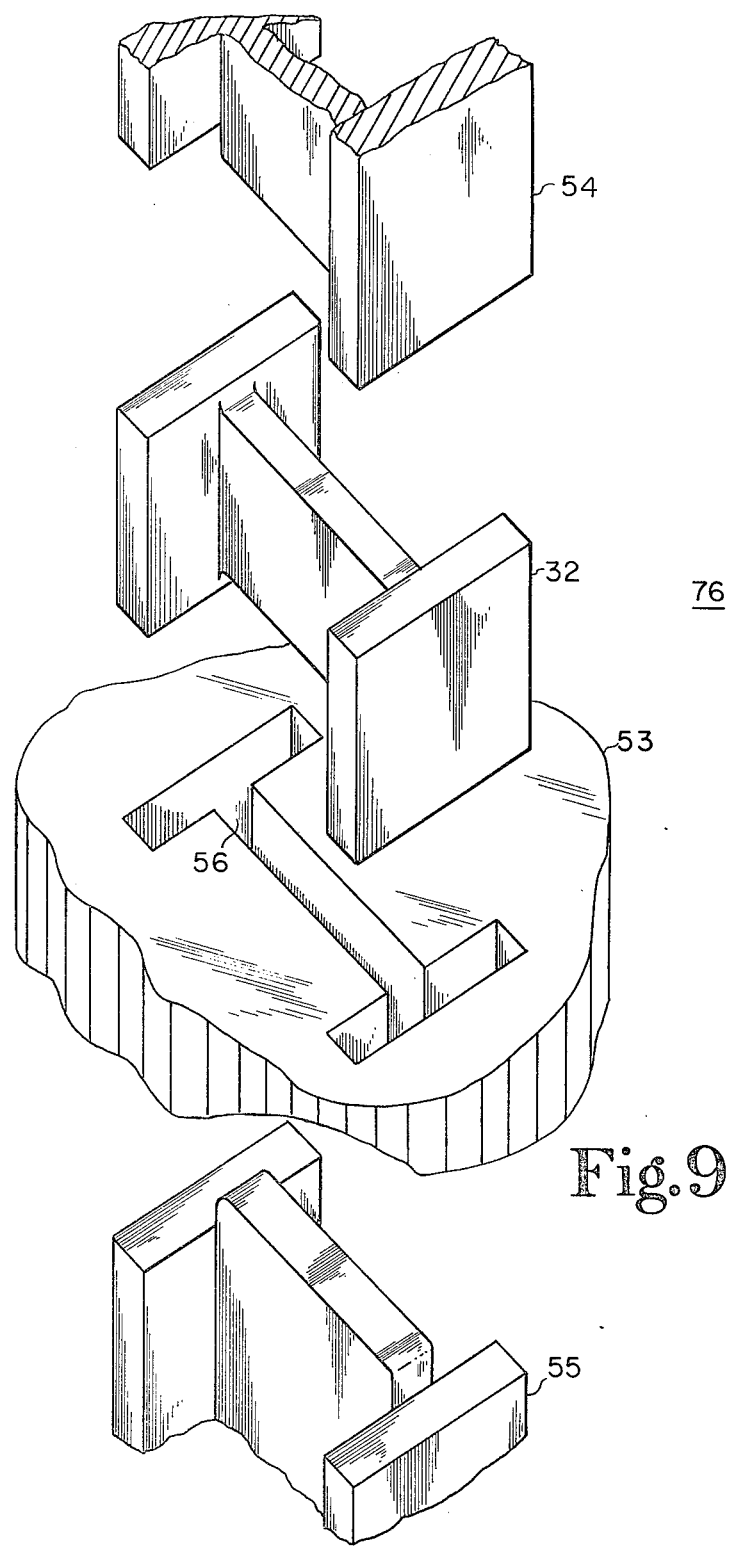
FIG. 9 illustrates the core of the structure of FIG. 3 and a punch-press tool used in the manufacture thereof.

H-bar core 32, with generally rectangular slabs for the center and end sections 32a–32c, as illustrated in FIG. 7, may be formed by a relatively simple punch-press process. As illustrated in FIG. 9, the punch-press tool 76 for forming rectangular H-bar core 32 comprises a die 53 with upper and lower punches 54 and 55. A cavity 56 is formed in die 53, having an outline conforming to the H-bar core outline of core 32. Upper and lower punches 54 and 55 also have outlines which conform to the H-bar core outline.

Core 32 is composed of a magnetizable material such as compressed and heat-fired particles of ferrite. Lower punch 55 is inserted into cavity 56 at the bottom of die 53. Loose ferrite powder is then poured into the cavity. Upper punch 54 is then lowered into the cavity and compresses the ferrite powder to form a block of core material in the H-bar core shape illustrated by core 32 of FIG. 9. The core is then heat-fired in an oven to harden the core and prevent it from crumbling and to establish the desired magnetic properties in the core material. After removal from the oven and the elapse of a cool-down period, the core is immediately available for insertion into plastic housing 41 of linearity corrector 30 without the need for any further processing steps.

In contrast, conventional nonrectangularly sectioned H-cores for linearity corrector structures may require several steps in addition to the aforementioned punch-pressing and heat-firing steps. An example of a conventional, H-core linearity corrector is illustrated by the structure 57 of FIG. 10a. Conventional linearity corrector structure 57 comprises a cylindrically sectioned H-core 58, cylindrical permanent magnets 59 and a coil 60. H-core 58 includes a relatively small diameter center section cylinder and relatively large diameter end section cylinders.

Figure 10:
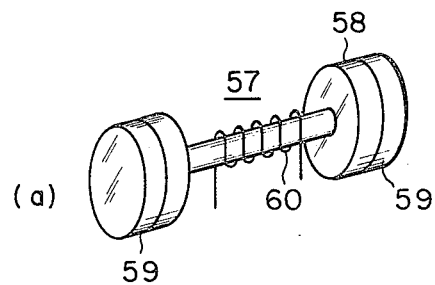
FIGS. 10a and 10b illustrate a prior art linearity corrector structure and a solid cylinder of magnetizable material used in the core manufacture of the prior art structure.
Figure 10:
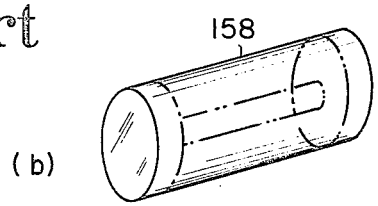

Cylindrical H-core 58 is manufactured from a relatively large diameter cylinder 158, illustrated in FIG. 10b. Cylinder 158 is formed by punch-pressing and compacting ferrite powder poured into a cylindrically shaped cavity of a punch-press tool. After cylinder 158 is fired, an additional processing step is required in order to obtain the H-core shape of core 58 in FIG. 10a. The central portion of cylinder 158 is ground down to the smaller diameter required. Such an additional grinding step is relatively time consuming, is relatively wasteful of ferrite material, and results in a higher part reject rate when compared with the manufacture of rectangularly sectioned H-bar core 32 of FIG. 7.

The plastic housing or coilform 41 of linearity corrector structure 30 illustrated in FIGS. 3 and 4 is in the form of a cup open at the top to receive H-bar core 32. The side walls of the coilform cup generally conform to the shape of the H-bar core. The conductor turns of linearity coil 31 are wound around the center section 41a of coilform cup 41 with the lead conductors 34 and 35 of coil 31 being wrapped around outward projections 44 formed in the walls of the end sections 41b and 41c of the coilform cup. As illustrated in FIG. 4, the height of the sidewalls of the center section 41a of coilform cup 41 is greater than the height of the center section 32a of H-bar core 32. The conductor turns of linearity coil 31 therefore do not contact the relatively sharp edges of the rectangular center section of the core. H-bar core 32 may retain its sharp edges. A manufacturing step to grind smooth the edges of the core is therefore unneeded.

Figure 11:
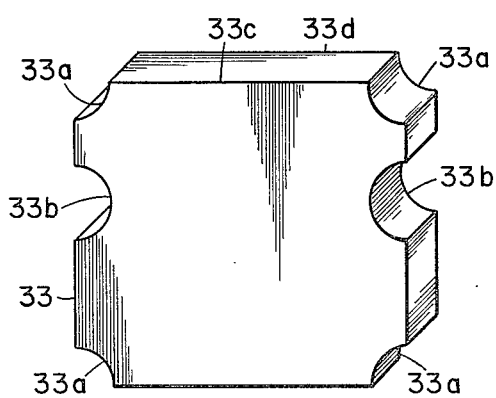
FIG. 11 illustrates a permanet magnet used in the structure of FIG. 3.

Each of two permanent magnets 33 is located in a respective end section 41b or 41c of coilform cup 41 adjacent a respective end section 32b or 32c of core 32. As illustrated in FIG. 11, a permanent magnet 33 comprises a generally rectangular slab of magnetized material. The magnetized material may comprise, for example, barium ferrite mixed in a plastic binder to form a spongy or rubber-like slab readily deformable but which returns to its original shape upon removal of the deforming forces. The barium ferrite slab 33 is permanently magnetized across the slab thickness so that a north pole exists on one of the slab faces 33c and 33d and a south pole exists on the other face. When permanent magnet 33 is located adjacent an end flange of core 32, the magnet is attracted to the core and close contact is developed between adjacent faces of magnet and flange.

During the latter portion of horizontal scan, current flows into lead conductor 35 of linearity coil 31 in FIG. 3 and flows out of lead conductor 34. The winding polarity of linearity coil 31 is such that the magnetic flux in the center section 32a of core 32 flows from left to right in FIG. 4, as illustrated by the arrows 61. To enable the center section of core 32 to become magnetically saturated in the second half of horizontal scan, as is required for producing linearity correction, the orientation of permanent magnets 33 within coilform cup 41 is such that the face of the permanent magnet contacting core end flange 32b is a north pole and the face of the permanent magnet contacting end flange 32c is a south pole. The height of core center section 32a is reduced compared to the height of the end flanges 32b and 32c to aid in the magnetic saturation of the core center section during the latter half of horizontal scan.

The magnetic flux produced by the two permanent magnets 33 that flows in core 32 establishes the DC magnetic bias of the core. The slope of the inductance curve of FIG. 12 as well as the average inductance of linearity corrector 30, about which point the inductance varies within the horizontal trace interval, is a function of the amount of flux coupled into core center section 32a from permanent magnets 33. By designing linearity corrector structure 30 so as to permit adjustment of the flux coupling between the permanent magnets and the core of the corrector structure, a raster width or raster centering adjustment may be provided without the need for a separate adjustable width or centering coil in circuit with the horizontal deflection winding.

As illustrated in FIG. 5, curved protrusions or bosses are formed in the upper inside portion of opposite sidewalls of each end section 41b or 41c of coilform cup 41. As illustrated in FIGS. 5 and 11, curved indentations or notches 33a, conforming to the shape of the bosses 42, are formed at the corners of each permanent magnet 33. Curved indentations 33b are also formed at intermediate locations in the slab sides of the permanent magnet. The bosses and indentations cooperate to secure the permanent magnets at different levels above the bottom of the coilform cup, thereby permitting the amount of bias magnetic flux flowing in the H-bar core to be adjusted.

Maximum coupling of bias flux into core 32 occurs when a permanent magnet 33 is resting near the bottom of coilform cup 41, as illustrated in FIG. 5. In this down position of the permanent magnet, maximum surface area contact exists between adjacent faces of the permanent magnet and the associated end flange of the core.

Figure 6:
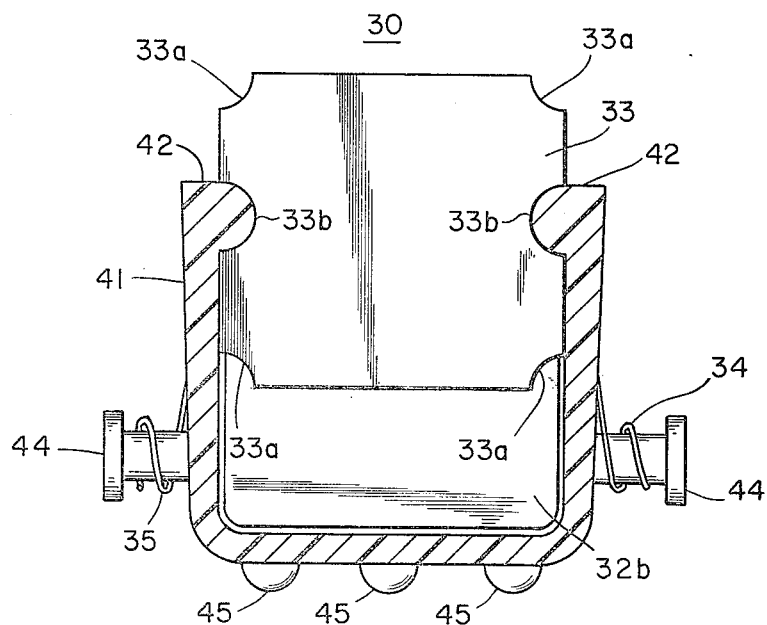
FIG. 6 illustrates the same cross-sectional view of FIG. 5 except that the permanent magnet illustrated is differently positioned.

Less coupling of bias flux into the core occurs when a permanent magnet is raised above the bottom of the coilform cup, as illustrated in FIG. 6. In the up position of FIG. 6, bosses 42 are received into the intermediate indentations 33b of permanent magnet 33. Bosses 42 function as a spring detent to hold the permanent magnet above the coilform bottom. In the up position of permanent magnet 33, illustrated in FIG. 6, less surface area contact between adjacent faces of the permanent magnet and core end flange exist than when the magnet is in the down position.

Using bosses 42 as a spring detent, several adjustments to the slope of the inductance curve of FIG. 12 are permitted. The steepest sloped inductance curve 80 for greatest raster compression at the beginning of trace, illustrated in FIG. 12, is obtained when both of the permanent magnets 33 are in the down position; intermediately sloped curve 81 is obtained when one permanent magnet is in the up position and the other is in the down position; and the least sloped or flattest curve 82 at the beginning of trace is obtained when both magnets are in the up position.

An alternate design of adjustable linearity corrector 30 has one of the permanent magnets nonadjustable with two or more intermediate notches formed in the sides of the other magnet. This other magnet can therefore be secured at any one of two or more levels above the bottom of the coilform cup.

We claim:

1. A structure for providing linearity correction to scanning current in a deflection winding during a scanning interval, comprising:

a core of magnetizable material, including rectangular center and end sections, each of generally rectangular cross-section, with the faces of said end sections oriented generally perpendicular to an axis of said center section to form an H-bar core;

a coilform cup with sides generally conforming to the shape of said H-bar core and receiving said H-bar core through an opening in said coilform cup;

a first permanent magnet magnetically biasing said H-bar core and located in said coilform cup adjacent one of said end sections of said H-bar core; and a linearity coil with conductor turns wound around said coilform cup over said center section of said H-bar core.

2. The structure of claim 1 in combination with a deflection circuit including a deflection generator coupled to said deflection winding for generating said scanning current in said deflection winding, wherein said linearity coil is coupled to said deflection winding such that the bias magnetic flux developed by said first permanent magnet flows in the center section of said H-bar core in a direction that opposes the magnetic flux produced in said center section by current in said linearity coil during a first portion of the scanning interval and aids the magnetic flux produced by current in said coil during a second portion of the scanning interval.

3. A structure according to claim 1 including a second permanent magnet magnetically biasing said H-bar core and located in said coilform cup adjacent the other end section of said H-bar core.

4. A structure according to claim 3 wherein the height of said center section of said H-bar core is less than that of either one of said end sections.

5. A structure according to claim 4 wherein the height of said center section of said H-bar core is less than the height of an adjacent side of the center section of said coilform cup.

6. A structure according to claim 5 wherein said coilform cup includes an outwardly projecting member at each end of said coilform cup, with each end of said linearity coil being wrapped around a respective outwardly projecting member.

7. A structure according to claims 3, 4 or 5 wherein each of said first and second permanent magnets is of slab shape, with a slab face contacting the adjacent face of the associated end section of said H-bar core, each permanent magnet being magnetized across the slab thickness.

8. A structure according to claim 7 wherein opposite walls of each end section of said coilform cup are formed with inwardly protruding bosses, each of said two permanent magnets having an indentation at an intermediate location in opposite slab sides capable of receiving a boss.

9. A structure according to claim 1 including means for securing said first permanent magnet at different levels above the bottom of said coilform cup to adjust the amount of bias magnetic flux flowing in said H-bar core.

10. A structure according to claim 9 wherein said first permanent magnet is of slab shape, with a slab face contacting the adjacent face of the associated end section of said H-bar core, said first permanent magnet being magnetized across the slab thickness.

11. A structure according to claim 10 wherein said securing means comprises inwardly protruding bosses formed in opposing walls of the end section of said coilform cup associated with said first permanent magnet and complementary indentations formed at intermediate locations in opposite sides of said slab shaped first permanent magnet.

12. A structure according to claim 11 including a second permanent magnet magnetically biasing said H-bar core and located in said coilform cup adjacent the other end section of said H-bar core.

13. In a horizontal deflection circuit with a horizontal deflection generator generating horizontal scanning current in a horizontal deflection winding during a horizontal scanning interval; a linearity reactor with a reactor winding coupled to said horizontal deflection winding, the inductance of which reactor varies during the horizontal scanning interval in a manner that provides linearity correction to said horizontal scanning current, said reactor comprising:

a core of magnetizable material having a generally rectangularly shaped center section widening to form a generally rectangularly shaped end flange at each end thereof, a housing with walls generally conforming to the shape of said core, open at one side to receive said core, a permanent magnet of slab shape magnetically biasing said core and located in said housing, a face of said magnet substantially contacting an end flange of said core, said reactor winding having conductor turns wound around said core housing over said center section of said core.

14. A linearity reactor according to claim 13 including another permanent magnet of slab shape magnetically biasing said core and located in said housing, a face of said other magnet substantially contacting the other end flange of said core.

15. A linearity reactor according to claim 14 wherein each of said permanent magnets is magnetized across opposite slab faces, the bias flux generated in the center section of said core by one of said permanent magnets aiding the bias flux generated by the other magnet.

16. A linearity reactor according to claim 15 wherein opposite walls at each end of said housing include inwardly directed bosses forming a spring detent, each of said two permanent magnets having an indentation at an intermediate location in opposite slab sides capable of receiving a boss.

17. A linearity reactor according to claim 16 wherein each of said two permanent magnets is formed of a rubber-like material.

18. A linearity reactor according to claim 17 wherein said rubber-like material comprises barium ferrite mixed in a plastic binder.

* * * * *